United States Patent
Harada et al.

(10) Patent No.: US 9,209,041 B2
(45) Date of Patent: Dec. 8, 2015

(54) PLASMA PROCESSING METHOD AND PLASMA PROCESSING APPARATUS

(71) Applicant: Tokyo Electron Limited, Tokyo (JP)

(72) Inventors: Akitoshi Harada, Miyagi (JP); Yen-Ting Lin, Hsin-chu (TW); Chih-Hsuan Chen, Hsin-chu (TW); Ju-Chia Hsieh, Hsin-chu (TW); Shigeru Yoneda, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/424,497

(22) PCT Filed: Aug. 27, 2013

(86) PCT No.: PCT/JP2013/072893
§ 371 (c)(1),
(2) Date: Feb. 27, 2015

(87) PCT Pub. No.: WO2014/034674
PCT Pub. Date: Mar. 6, 2014

(65) Prior Publication Data
US 2015/0221522 A1   Aug. 6, 2015

Related U.S. Application Data

(60) Provisional application No. 61/696,435, filed on Sep. 4, 2012.

(30) Foreign Application Priority Data

Aug. 29, 2012  (JP) .................................. 2012-189063

(51) Int. Cl.
| | | |
|---|---|---|
| H01L 21/302 | (2006.01) | |
| H01L 21/461 | (2006.01) | |
| H01L 21/311 | (2006.01) | |
| H01L 21/67 | (2006.01) | |
| H01J 37/32 | (2006.01) | |
| H01L 21/02 | (2006.01) | |
| H01L 21/3205 | (2006.01) | |
| H01L 21/321 | (2006.01) | |

(52) U.S. Cl.
CPC ..... *H01L 21/31116* (2013.01); *H01J 37/32449* (2013.01); *H01L 21/0217* (2013.01); *H01L21/02164* (2013.01); *H01L 21/321* (2013.01); *H01L 21/32053* (2013.01); *H01L 21/67069* (2013.01); *H01J 2237/334* (2013.01); *H01J 2237/3321* (2013.01)

(58) Field of Classification Search
CPC ..................... H01L 21/31116; H01L 21/0228; H01L 21/02274; H01J 37/32449
USPC ....................................... 438/710; 156/345.24
See application file for complete search history.

(56) References Cited

FOREIGN PATENT DOCUMENTS

| | | | |
|---|---|---|---|
| JP | 2001-335937 | A | 12/2001 |
| JP | 2002-313727 | A | 10/2002 |
| JP | 2006-261216 | A | 9/2006 |
| JP | 2010-080798 | A | 4/2010 |
| WO | 02/41376 | A1 | 5/2002 |

OTHER PUBLICATIONS

International Search Report for PCT/JP2013/072893 dated Nov. 19, 2013.

*Primary Examiner* — Roberts Culbert
(74) *Attorney, Agent, or Firm* — Pearne & Gordon LLP

(57) ABSTRACT

A plasma processing method performs an etching process of supplying a fluorine-containing gas into a plasma processing space and etching a target substrate, in which a silicon oxide film or a silicon nitride film is formed on a surface of a nickel silicide film, with plasma of the fluorine-containing gas (process S101). Then, the plasma processing method performs a reduction process of supplying a hydrogen-containing gas into the plasma processing space and reducing, with plasma of the hydrogen-containing gas, a nickel-containing material deposited on a member, of which a surface is arranged to face the plasma processing space, after the etching process (process S102). Thereafter, the plasma processing method performs a removal process of supplying an oxygen-containing gas into the plasma processing space and removing nickel, which is obtained by reducing the nickel-containing material in the reduction process, with plasma of the oxygen-containing gas (process S103).

8 Claims, 6 Drawing Sheets

US 9,209,041 B2

PLASMA PROCESSING METHOD AND PLASMA PROCESSING APPARATUS

CROSS-REFERENCE TO RELATED APPLICATION

This application is a U.S. national phase application under 35 U.S.C. §371 of PCT Application No. PCT/JP2013/072893 filed on Aug. 27, 2013, which claims the benefit of Japanese Patent Application No. 2012-189063 filed on Aug. 29, 2012, and U.S. Provisional Application Ser. No. 61/696,435 filed on Sep. 4, 2012, the entire disclosures of which are incorporated herein by reference.

TECHNICAL FIELD

The embodiments described herein pertain generally to a plasma processing method and a plasma processing apparatus.

BACKGROUND

In a semiconductor manufacturing process, a plasma processing apparatus that performs a plasma process of etching or depositing a thin film has been widely used. Examples of the plasma processing apparatus may include a plasma CVD (Chemical Vapor Deposition) apparatus that performs a deposition process of a thin film or a plasma etching apparatus that performs an etching process.

The plasma processing apparatus includes, for example, a processing vessel that partitions a plasma processing space; a sample table that mounts a target substrate thereon within the processing vessel; and a gas supply system that supplies a processing gas for plasma reaction into the processing vessel. Further, the plasma processing apparatus also includes a plasma generation device that supplies electromagnetic energy such as a microwave, a RF wave, etc. to excite the processing gas within the processing vessel into plasma; and a bias voltage application device that applies a bias voltage to the sample table to accelerate ions in the plasma toward the target substrate mounted on the sample table.

Meanwhile, it has been known that in a plasma processing apparatus, when forming contact holes for field effect transistor (FET), a target substrate, in which a silicon oxide film or a silicon nitride film is formed on a surface of a silicide film, is etched. In this regard, for example, Patent Document 1 describes that a target substrate, in which a silicon oxide film or a silicon nitride film is formed on a surface of a nickel silicide film, is arranged in a plasma processing space, and the target substrate is etched toward the nickel silicide film serving as a base.

Patent Document 1: Japanese Patent Laid-open Publication No. 2010-080798

DISCLOSURE OF THE INVENTION

Problems to be Solved by the Invention

However, in the conventional technology, there has been a risk that etching characteristics of the target substrate are degraded (changed) with a lapse of time. That is, in the convention technology, when the target substrate is etched toward the nickel silicide film serving as a base film, the nickel silicide film itself may be etched. For this reason, in the conventional technology, a nickel-containing material generated from the etched nickel silicide film is accumulatively deposited on various components facing the plasma processing space, so that plasma density within the plasma processing space is varied. As a result, the etching characteristics of the target substrate may be degraded (changed) with a lapse of time.

Means for Solving the Problems

In one example embodiment, a plasma processing method is performed in a plasma processing apparatus, and the plasma processing method includes a first process, a second process and a third process. In the first process, a fluorine-containing gas is supplied into a plasma processing space and a target substrate, in which a silicon oxide film or a silicon nitride film is formed on a surface of a nickel silicide film, is etched with plasma of the fluorine-containing gas. Further, in the second process, a hydrogen-containing gas is supplied into the plasma processing space and a nickel-containing material deposited on a member, of which a surface is arranged to face the plasma processing space, is reduced with plasma of the hydrogen-containing gas, after the first process. Furthermore, in the third process, an oxygen-containing gas is supplied into the plasma processing space and nickel, which is obtained by reducing the nickel-containing material in the second process, is removed with plasma of the oxygen-containing gas.

Effect of the Invention

In accordance with various example embodiments, it is possible to provide a plasma processing method and a plasma processing apparatus, capable of suppressing etching characteristics of the target substrate from being degraded (changed) with a lapse of time.

MODE FOR CARRYING OUT THE INVENTION

Figure 1:
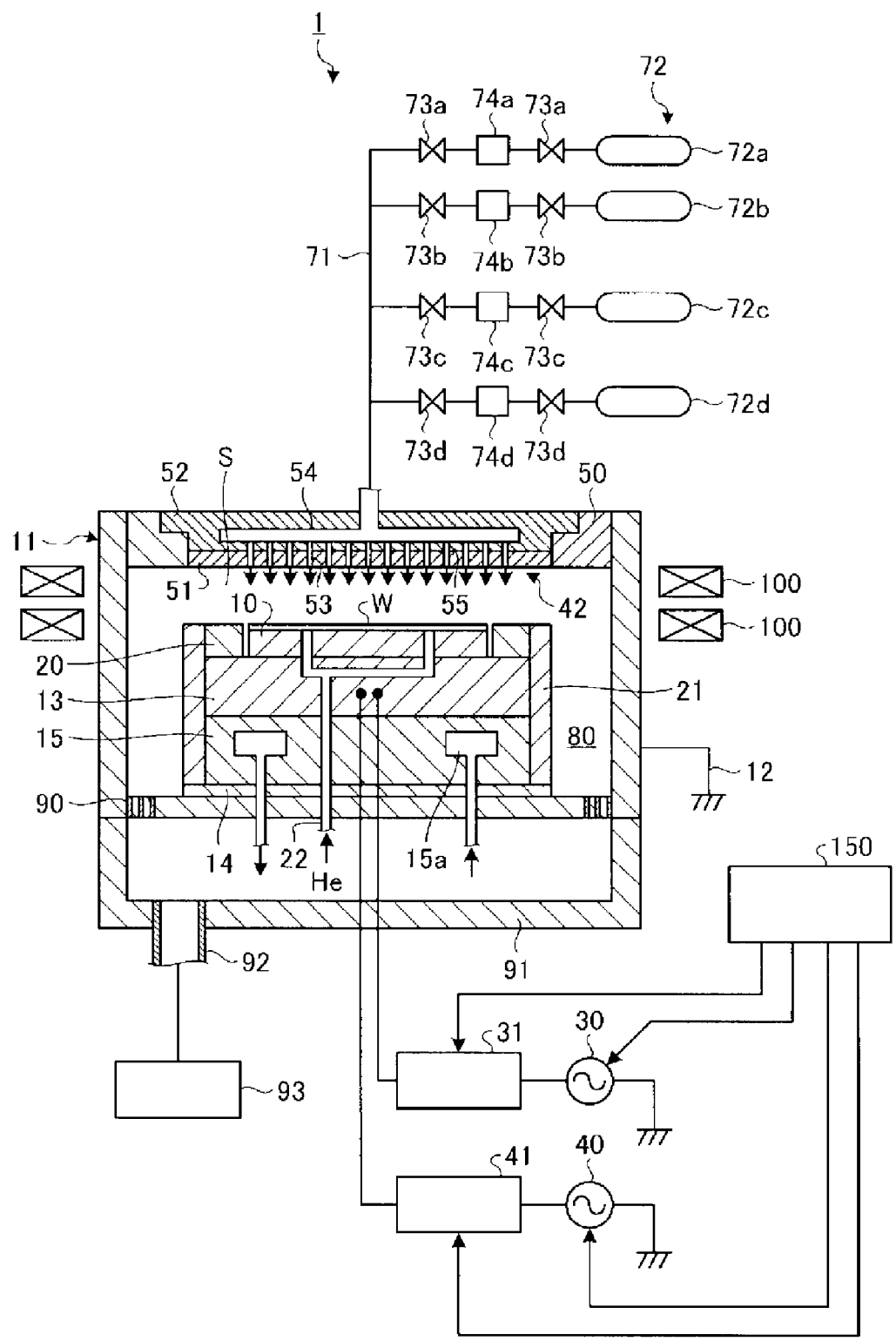
FIG. 1 is a longitudinal cross-sectional view illustrating a schematic configuration of a plasma processing apparatus in accordance with an example embodiment.

Hereinafter, various example embodiments will be explained in detail with reference to the accompanying drawings. Further, in the drawings, the same or corresponding components will be respectively assigned the same reference numerals.

In one example embodiment, a plasma processing method performed in a plasma processing apparatus includes a first process of supplying a fluorine-containing gas into a plasma processing space to generate plasma of the fluorine-containing gas and etching a target substrate, in which at least one of a silicon oxide film and a silicon nitride film is formed on a surface of a nickel silicide film, with the plasma of the fluorine-containing gas; a second process of supplying a hydrogen-containing gas into the plasma processing space to generate plasma of the hydrogen-containing gas and reducing, with the plasma of the hydrogen-containing gas, a nickel-containing material deposited on a member, of which a surface is arranged to face the plasma processing space, after the first process; and a third process of supplying an oxygen-containing gas into the plasma processing space to generate plasma of the oxygen-containing gas and removing nickel, which is obtained by reducing the nickel-containing material in the second process, with the plasma of the oxygen-containing gas. Further, variation in Vpp on the target substrate is suppressed by removing the nickel-containing material deposited on the member, of which the surface is arranged to face the plasma processing space, through the second process and the third process.

The second process and the third process may be repeatedly performed at least twice.

The second process may be performed by supplying the hydrogen-containing gas and a nitrogen-containing gas.

The nitrogen-containing gas may be at least one of a $N_2$ gas, a $NH_3$ gas, and a $N_2H_2$ gas.

The hydrogen-containing gas may be at least one of a $H_2$ gas, a $CH_3F$ gas, a $CH_2F_2$ gas, a $CHF_3$, a $NH_3$ qas, a $N_2H_2$ gas.

The oxygen-containing gas may be at least one of $O_2$ gas, a $CO_2$ gas, and a CO gas.

In another example embodiment, a plasma processing apparatus includes a processing vessel configured to partition a plasma processing space accommodating therein a target substrate, in which at least one of a silicon oxide film and a silicon nitride film is formed on a surface of a nickel silicide film; a first gas supply unit configured to supply a fluorine-containing gas into the plasma processing space; a second gas supply unit configured to supply a hydrogen-containing gas into the plasma processing space; a third gas supply unit configured to supply an oxygen-containing gas into the plasma processing space; and a control unit configured to perform a first process of supplying the fluorine-containing gas into the plasma processing space from the first gas supply unit to generate plasma of the fluorine-containing gas and etching the target substrate with the plasma of the fluorine-containing gas; a second process of supplying the hydrogen-containing gas into the plasma processing space from the second gas supply unit to generate plasma of the hydrogen-containing gas and reducing, with the plasma of the hydrogen-containing gas, a nickel-containing material deposited on a member, of which a surface is arranged to face the plasma processing space, after the first process; and a third process of supplying the oxygen-containing gas into the plasma processing space from the third gas supply unit to generate plasma of the oxygen-containing gas and removing nickel, which is obtained by reducing the nickel-containing material in the second process, with the plasma of the oxygen-containing gas and configured to suppress variation in Vpp on the target substrate by removing the nickel-containing material deposited on the member, of which the surface is arranged to face the plasma processing space, through the second process and the third process. Further, the variation in the Vpp on the target substrate is suppressed by removing the nickel-containing material deposited on the member, of which the surface is arranged to face the plasma processing space, through the second process and the third process.

FIG. 1 is a longitudinal cross-sectional view illustrating a schematic configuration of a plasma processing apparatus in accordance with an example embodiment. As depicted in FIG. 1, a plasma processing apparatus 1 includes a substantially cylindrical processing vessel 11 having therein a plasma processing space S in which a plasma process is performed. The processing vessel 11 is electrically grounded via a ground line 12. Further, a surface of the processing vessel 11 faces the plasma processing space S. That is, the processing vessel 11 is provided such that the surface thereof faces the plasma processing space S.

Within the processing vessel 11, a wafer chuck 10 configured to hold a wafer W as a target substrate is provided. A bottom surface of the wafer chuck 10 is supported on a susceptor 13 serving as a lower electrode. The susceptor 13 is made of a metal such as aluminum and has a substantially disk shape. A supporting table 15 is provided at a bottom of the processing vessel 11 via an insulating plate 14, and the susceptor 13 is supported on a top surface of the supporting table 15. An electrode (not illustrated) is embedded in the wafer chuck 10, and the wafer chuck 10 is configured to attract and hold the wafer W by an electrostatic force generated by applying a DC voltage to the electrode.

A conductive focus ring 20 made of, for example, silicon is provided on an outer peripheral portion of the wafer chuck 10 as a top surface of the susceptor 13 in order to improve uniformity of a plasma process. Outer side surfaces of the susceptor 13, the supporting table 15, and the focus ring 20 are covered with a cylindrical member 21 made of, for example, quartz. Further, a surface of the focus ring 20 faces the plasma processing space S. That is, the focus ring 20 is provided such that the surface thereof faces the plasma processing space S.

Within the supporting table 15, a coolant path 15a configured to allow a coolant to flow therein is formed into, for example, a circular ring shape. By adjusting a temperature of the coolant supplied into the coolant path 15a, a temperature of the wafer W held on the wafer chuck 10 can be controlled. Further, a heat transfer gas line 22 configured to supply a heat transfer gas, e.g., a helium gas into a gap between the wafer chuck 10 and the wafer W held on the wafer chuck 10 is provided to pass through, for example, the susceptor 13, the supporting table 15, and the insulating plate 14.

The susceptor 13 is electrically connected to a first high frequency power supply 30 configured to apply a high frequency power for plasma generation to the susceptor 13 via a first matching device 31. The first high supply power supply 30 is configured to output a high frequency power having a frequency of, for example, from 27 MHz to 100 MHz, e.g., 40 MHz in the present example embodiment. The first matching device 31 is configured to match internal impedance of the first high frequency power supply 30 with load impedance, and to allow the internal impedance of the first high frequency power supply 30 and the load impedance to be apparently matched with each other when plasma is generated within the processing vessel 11.

Further, the susceptor 13 is also electrically connected to a second high frequency power supply 40 configured to apply a bias voltage for ion attraction into the wafer W by applying a high frequency power to the susceptor 13 via a second matching device 41. The second high frequency power supply 40 is configured to output a high frequency power having a frequency of, for example, from 400 kHz to 13.56 MHz, e.g., 13.56 MHz in the present example embodiment. The frequency of the high frequency power outputted from the second high frequency power supply 40 is lower than the frequency of the high frequency power outputted from the first high frequency power supply 30. Like the first matching device 31, the second matching device 41 is also configured to match internal impedance of the second high frequency power supply 40 with load impedance.

The first high frequency power supply 30, the first matching device 31, the second high frequency power supply 40, and the second matching device 41 are connected to a control unit 150 to be described later, and the overall operations thereof are controlled by the control unit 150.

Above the susceptor 13 as the lower electrode, an upper electrode 42 is provided to face the susceptor 13 in parallel. The upper electrode 42 is supported on a ceiling portion of the processing vessel 11 via a conductive supporting member 50. Accordingly, the upper electrode 42 is also electrically grounded like the processing vessel 11.

The upper electrode 42 includes an electrode plate 51 that forms a surface of the upper electrode 42 facing the wafer W held on the wafer chuck 10; and an electrode supporting body 52 that supports the electrode plate 51 from above. Multiple gas discharge holes 53 configured to supply a processing gas into the processing vessel 11 are formed through the electrode plate 51. The electrode plate 51 is made of, for example, a semiconductor or a conductor having low Joule heat and low resistance, and in the present example embodiment, for example, silicon is used. Further, a surface of the electrode plate 51 facing the wafer W faces the plasma processing space S. That is, the electrode plate 51 is provided such that the surface thereof faces the plasma processing space S.

The electrode supporting body 52 is made of a conductor, and in the present example embodiment, for example, aluminum is used. A gas diffusion space 54 having a substantially disk shape is formed in a central portion within the electrode supporting body 52. Multiple gas through holes 55 extended downwards from the gas diffusion space 54 are formed in a lower portion of the electrode supporting body 52, and the gas discharge holes 53 communicate with the gas diffusion space 54 via the gas through holes 55.

The gas diffusion space 54 is connected to a gas supply line 71. The gas supply line 71 is connected to a processing gas supply source 72 as illustrated in FIG. 1, and the processing gas supplied from the processing gas supply source 72 is introduced into the gas diffusion space 54 via the gas supply line 71. The processing gas introduced into the gas diffusion space 54 is then discharged into the processing vessel 11 through the gas through holes 55 and the gas discharge holes 53. That is, the upper electrode 42 serves as a shower head configured to supply the processing gas into the processing vessel 11.

In the present example embodiment, the processing gas supply source 72 includes a gas supply unit 72a, a gas supply unit 72b, a gas supply unit 72c, and a gas supply unit 72d. The gas supply unit 72a is configured to supply a fluorine-containing gas as an etching gas into the plasma processing space S. The fluorine-containing gas is, for example, a $C_4F_6$ gas and a $CH_2F_2$ gas. Further, an $O_2$ gas is appropriately added to the fluorine-containing gas. The gas supply unit 72a is an example of the first gas supply unit configured to supply the fluorine-containing gas into the plasma processing space S.

The gas supply unit 72b is configured to supply a hydrogen-containing gas as a reducing gas after an etching process into the plasma processing space S. The hydrogen-containing gas is at least any one of, for example, a $H_2$ gas, a $CH_3F$ gas, a $CH_2F_2$ gas, and a $CHF_3$ gas. The gas supply unit 72b is an example of the second gas supply unit configured to supply the hydrogen-containing gas into the plasma processing space S.

The gas supply unit 72c is configured to supply an oxygen-containing gas as a removing gas of deposit after a reduction process into the plasma processing space S. The oxygen-containing gas is at least any one of, for example, an $O_2$ gas, a $CO_2$ gas, and a CO gas. The gas supply unit 72c is an example of the third gas supply unit configured to supply the oxygen-containing gas into the plasma processing space S.

Further, the gas supply unit 72d is configured to supply a nitrogen-containing gas as a reducing gas after the etching process into the plasma processing space S. The nitrogen-containing gas is, for example, a $N_2$ gas. Although not illustrated, the processing gas supply source 72 supplies gases (for example, an Ar gas, and the like) to be used for various processes in the plasma processing apparatus 1.

Furthermore, the processing gas supply source 72 includes valves 73a, 73b, 73c, and 73d and flow rate controllers 74a, 74b, 74c, and 74d respectively provided between the gas supply units 72a, 72b, 72c, and 72d and the gas diffusion space 54. The flow rates of the gases supplied into the gas diffusion space 54 are controlled by the flow rate controllers 74a, 74b, 74c, and 74d.

A gas exhaust path 80 serving as a flow path through which an atmosphere within the processing vessel 11 is exhausted to the outside of the processing vessel 11 is formed between an inner wall of the processing vessel 11 and an outer side surface of the cylindrical member 21 at a bottom portion of the processing vessel 11. A gas exhaust opening 90 is formed at a bottom surface of the processing vessel 11. A gas exhaust chamber 91 is provided under the gas exhaust opening 90, and a gas exhaust device 93 is connected to the gas exhaust chamber 91 via a gas exhaust line 92. By operating the gas exhaust device 93, the atmosphere within the processing vessel 11 is exhausted through the gas exhaust path 80 and the gas exhaust opening 90, and, thus, the inside of the processing vessel 11 can be depressurized to a preset vacuum level.

Around the processing vessel 11, a ring magnet 100 is arranged to be concentric with the processing vessel 11. By the ring magnet 100, a magnetic field can be formed in a space between the wafer chuck 10 and the upper electrode 42. The ring magnet 100 is configured to be rotatable by a non-illustrated rotation unit.

Further, a control unit 150 is provided in the plasma processing apparatus 1. The control unit 150 is, for example, a computer including a program storage unit (not illustrated) as a storage device, for example, a memory. The program storage unit also stores a program of operating the plasma processing apparatus 1 by controlling the respective power supplies 30 and 40 or the respective matching devices 31 and 41 and the flow rate controller 74. By way of example, the control unit 150 controls a process of supplying the fluorine-containing gas from the gas supply unit 72a into the plasma processing space S and etching the wafer W with plasma of the fluorine-containing gas. Further, for example, the control unit 150 controls a process of supplying the hydrogen-containing gas from the gas supply unit 72b into the plams processing space S and reducing, with plasma of the hydrogen-containing gas, a nickel-containing material deposited on a member (for example, the processing vessel 11, the electrode plate 51, and the focus ring 20), of which a surface is arranged to face the plasma processing space S, after etching the wafer W. Furthermore, for example, the control unit 150 controls a process of supplying the oxygen-containing gas from the gas supply unit 72c into the plasma processing space S and removing, with plasma of the oxygen-containing gas, nickel, which is obtained by reducing the nickel-containing material.

Further, the program is stored in a computer readable storage medium such as a hard disk (HD), a flexible disk (FD), a compact disk (CD), a magneto-optical disk (MO), a memory card or the like and may be installed in the control unit 150 from the computer readable storage medium.

Figure 2:
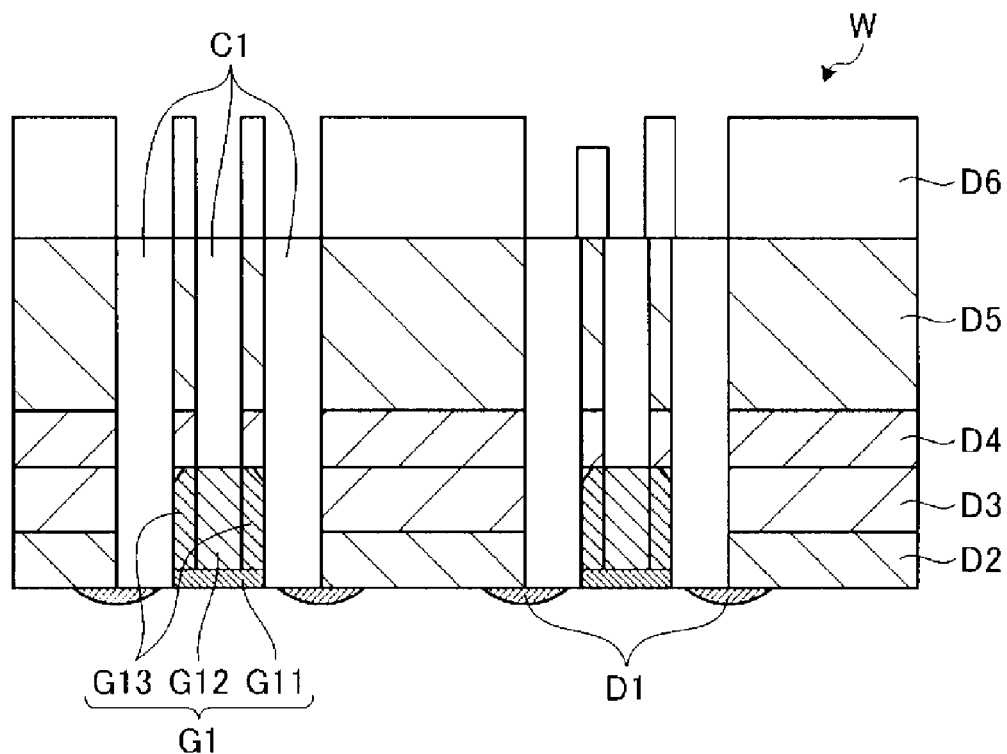
FIG. 2 is a diagram illustrating a configuration example of a wafer to be etched in the plasma processing apparatus in accordance with the example embodiment.

Hereinafter, a configuration example of the wafer W to be etched in the plasma processing apparatus 1 will be explained. FIG. 2 is a diagram illustrating a configuration example of the wafer to be etched in the plasma processing apparatus in accordance with the example embodiment. As depicted in FIG. 2, the wafer W includes a nickel silicide film D1, a silicon nitride film D2, a silicon oxide film D3, a silicon nitride film D4, a silicon oxide film D5, a resist film D6, and a gate electrode G1.

The nickel silicide film D1 is a base film constituting source/drain regions for field effect transistor (FET). On a surface of the nickel silicide film D1, the silicon nitride film D2, the silicon oxide film D3, the silicon nitride film D4, the silicon oxide film D5, and the resist film D6 are stacked in sequence. Although the present example embodiment illustrates an example where the silicon nitride film D2 is formed on the surface of the nickel silicide film D1, a silicon oxide film may be formed on the surface of the nickel silicide film D1.

The silicon nitride film D2 and the silicon nitride film D4 are etch stop films. The silicon oxide film D3 and the silicon oxide film D5 are interlayer insulating films. The resist film D6 is a mask film on which a preset pattern is formed. In the silicon nitride film D2, the silicon oxide film D3, the silicon nitride film D4, and the silicon oxide film D5, multiple contact holes C1 for FET are formed corresponding to the pattern of the resist film D6.

The gate electrode G1 includes a gate insulating film G11, a gate polysilicon film G12, and a sidewall insulating film G13.

Meanwhile, in the above-described plasma processing apparatus 1, in order to form the contact hole C1 in the wafer W, the wafer W is etched toward the nickel silicide film D1 with the resist film D6 as a mask. In the plasma processing apparatus 1, if the wafer W is etched toward the nickel silicide film D1 serving as a base film, the contact hole C1 reaches the nickel silicide film D1 and the nickel silicide film D1 itself may be etched. If the nickel silicide film D1 is etched, a nickel-containing material generated from the nickel silicide film D1 is deposited on members (for example, the processing vessel 11, the electrode plate 51, and the focus ring 20) of which surfaces are arranged to face the plasma processing space S. If the nickel-containing material is accumulatively deposited on the members of which the surfaces are arranged to face the plasma processing space S, plasma density within the plasma processing space S may be varied. As a result, etching characteristics of the wafer W may be degraded (changed) with a lapse of time. Hereinafter, explanation on this matter will be provided. Further, in the following descriptions, as an example of a member of which a surface is arranged to face the plasma processing space S, the electrode plate 51 of the upper electrode 42 will be explained, but it is not limited thereto. In the present example embodiment, a member of which a surface is arranged to face the plasma processing space S can also be applied to other members such as the processing vessel 11 and the focus ring 20.

Figure 3:
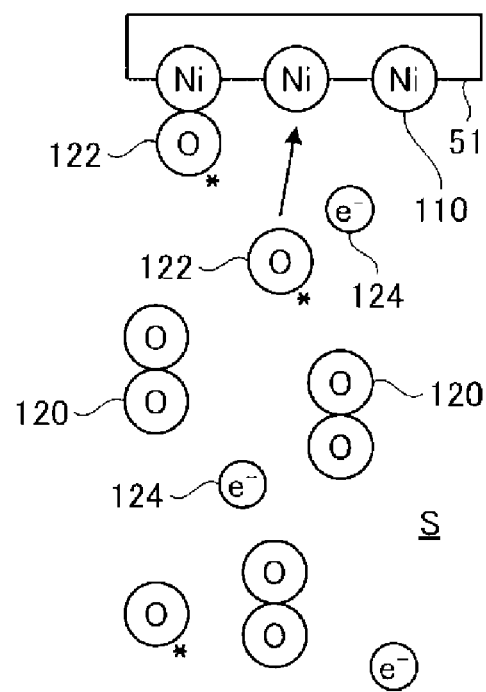
FIG. 3 is an explanatory diagram illustrating a mechanism of degradation (change) of etching characteristics of the wafer with a lapse of time when a nickel-containing material is deposited on an electrode plate of an upper electrode.

FIG. 3 is an explanatory diagram illustrating a mechanism of degradation (change) of etching characteristics of the wafer with a lapse of time when the nickel-containing material is deposited on the electrode plate of the upper electrode. FIG. 3 illustrates that an $O_2$ gas is supplied as an etching process gas into the plasma processing space S to be excited into plasma in a state where the nickel inclusion is deposited on the electrode plate 51 of the upper electrode 42. In FIG. 3, a particle model 110 is a model of nickel contained the nickel-containing material deposited on the electrode plate 51. Further, a particle model 120 is a model of oxygen contained in the $O_2$ gas. Furthermore, a particle model 122 is a model of an oxygen radical contained in the plasmarized $O_2$ gas. Moreover, a particle model 124 is a model of an electron contained in the plasmarized $O_2$ gas.

As depicted in FIG. 3, in a state where the nickel-containing material is deposited on the electrode plate 51 of the upper electrode 42, the oxygen radical contained in the plasmarized $O_2$ gas is inactivated by the nickel contained in the nickel-containing material. That is, the oxygen radical expressed by the particle model 122 is attracted to the nickel expressed by the particle model 110. The nickel-containing material reacts with the oxygen radical to be deposited as a nickel oxide such as $Ni_2O_3$ on the electrode plate 51. Therefore, the plasma density within the plasma processing space S in the state where the nickel-containing material is deposited is reduced as compared with a state where the nickel-containing material is not deposited. As a result, an amount of oxygen radicals supplied toward the wafer W is reduced, so that etching characteristics, such as an etching rate, of the wafer W are degraded (changed) with a lapse of time. Further, FIG. 3 illustrates an example where the $O_2$ gas is supplied as the etching process gas into the plasma processing space S. However, it is assumed that even if another processing gas is supplied into the plasma processing space S instead of the $O_2$ gas, the etching characteristics of the wafer W are degraded (changed) with a lapse of time in the same manner. Further, if a metal oxide such as $Ni_2O_3$ is accumulatively deposited on the electrode plate 51 of the upper electrode 42 for plasma generation, an electrostatic capacitance of the parallel plate type plasma processing apparatus is changed. As a result, if the same high frequency power is applied, the plasma density may be varied depending on an accumulation amount of the metal oxide film, so that the etching characteristics of the wafer W are degraded (changed) with a lapse of time.

Figure 4A:
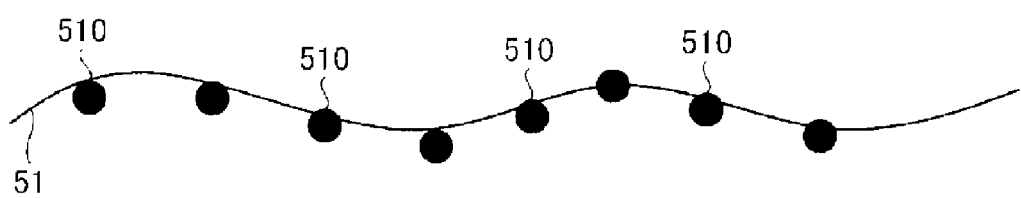
FIG. 4A is a diagram illustrating a model example in which the nickel-containing material is deposited on the electrode plate of the upper electrode.
Figure 4B:
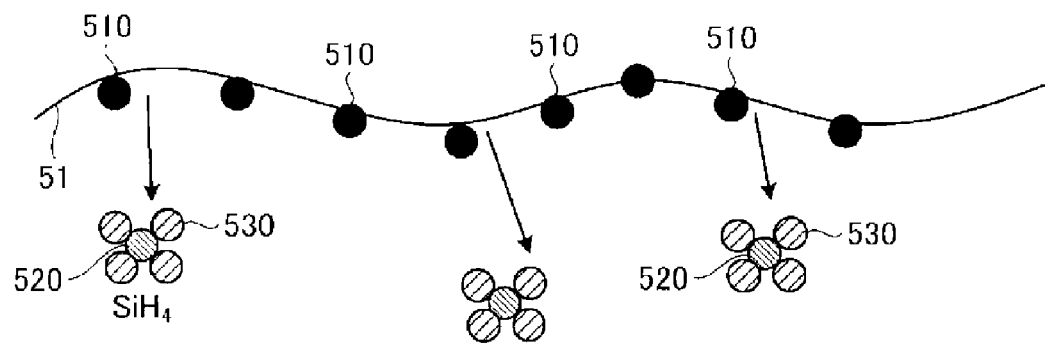
FIG. 4B is a diagram illustrating a model example in which the nickel-containing material is deposited on the electrode plate of the upper electrode.

Subsequently, there will be explained a model example in which the nickel-containing material is deposited on the electrode plate 51 of the upper electrode 42. FIG. 4A and FIG. 4B are diagrams each illustrating a model example in which the nickel-containing material is deposited on the electrode plate 51 of the upper electrode 42. FIG. 4A and FIG. 4B illustrate examples where the nickel-containing material such as $Ni_2O_3$ is deposited on the electrode plate 51 after the wafer W is etched. In FIG. 4A and FIG. 4B, a molecule model group 510 is a model of nickel deposited on the electrode plate 51 after the wafer W is etched.

In the plasma process in accordance with the present example embodiment, there is performed a first process of supplying the fluorine-containing gas (e.g., a $C_4F_6$ gas or a $CH_2F_2$ gas, and an $O_2$ gas) into the plasma processing space S and etching the wafer W with plasma of the fluorine-containing gas. By way of example, in the plasma process, in order to form the contact holes C1 in the wafer W, the wafer W is etched toward the nickel silicide film D1 with the plasma of the fluorine-containing gas with the resist film D6 as a mask. Thus, as depicted in FIG. 4A, Ni (molecule model group 510) as the nickel-containing material generated from the etched nickel silicide film D1 of the wafer W is deposited on the surface of the electrode plate 51. For this reason, the first process may be referred to as "etching process".

Further, in FIG. 4B, a molecule model group 530 is a model of hydrogen.

The etching process can be expressed by the following chemical reaction formula (1). Herein, H* denotes a hydrogen radical and CF* denotes a CF radical.

$$NiSi+H^*+CF^* \rightarrow Ni+SiH_4+CF^* \tag{1}$$

As shown in FIG. 4B, the Ni is deposited on the electrode plate 51, and oxidized by a radical of the $O_2$ gas supplied in the etching process to be deposited as $Ni_2O_3$. This deposition process can be expressed by the following chemical reaction formula (2). Herein, O* denotes an oxygen radical.

$$Ni+O^* \rightarrow Ni_2O_3 \tag{2}$$

Figure 5A:
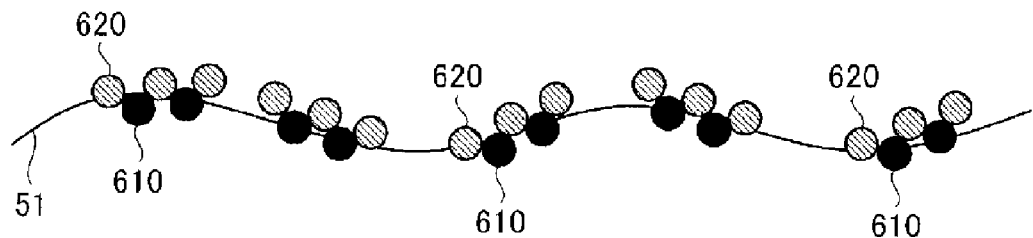
FIG. 5A is a diagram illustrating a model example of a plasma process in accordance with the present example embodiment.
Figure 5B:
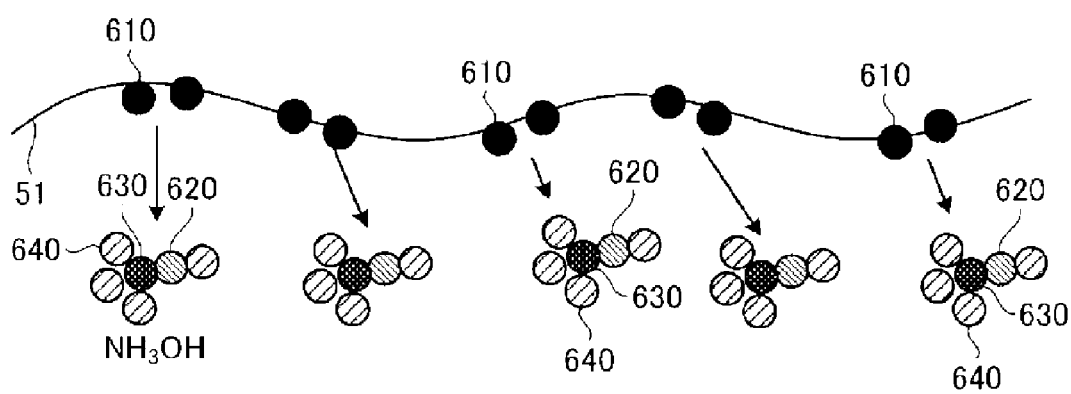
FIG. 5B is a diagram illustrating a model example of the plasma process in accordance with the present example embodiment.
Figure 5C:
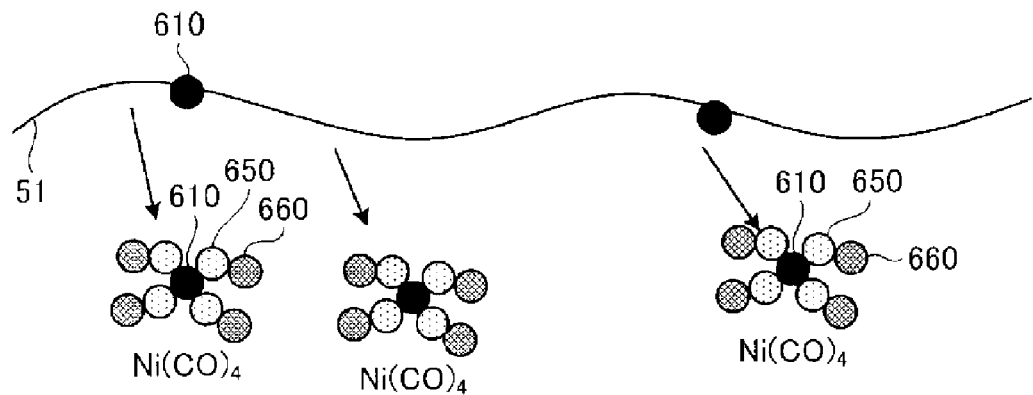
FIG. 5C is a diagram illustrating a model example of the plasma process in accordance with the present example embodiment.

Next, there will be explained a model example of a plasma process when $Ni_2O_3$ as the nickel-containing material is deposited on the electrode plate 51 after the wafer W is etched. FIG. 5A to FIG. 5C are diagrams each illustrating a model example of a plasma process in accordance with the present example embodiment. FIG. 5A to FIG. 5C illustrate examples where $Ni_2O_3$ as the nickel-containing material is deposited on the electrode plate 51 after the wafer W is etched. In FIG. 5A to FIG. 5C, a molecule model group 610 is a model of nickel contained in $Ni_2O_3$ deposited on the electrode plate 51 after the wafer W is etched. Further, in FIG. 5A to FIG. 5C, a molecule model group 620 is a model of oxygen contained in $Ni_2O_3$ deposited on the electrode plate 51 after the wafer W is etched.

In the plasma process in accordance with the present example embodiment, there is performed the first process of supplying the fluorine-containing gas (e.g., a $C_4F_6$ gas or a $CH_2F_2$ gas, and $O_2$) into the plasma processing space S and etching the wafer W with plasma of the fluorine-containing gas. By way of example, in the plasma process, in order to form the contact holes C1 in the wafer W, the wafer W is etched toward the nickel silicide film D1 with the plasma of the fluorine-containing gas with the resist film D6 as a mask. Thus, as depicted in FIG. 5A, $Ni_2O_3$ (the molecule model group 610 and the molecule model group 620) as the nickel-containing material generated from the nickel silicide film D1 of the etched wafer W is deposited on the surface of the electrode plate 51. For this reason, the first process may be referred to as "etching process".

Further, in FIG. 5B, a molecule model group 630 is a model of nitrogen. Furthermore, in FIG. 5B, a molecule model group 640 is a model of hydrogen.

In the plasma process in accordance with the present example embodiment, there is performed the second process of supplying the hydrogen-containing gas (e.g., a $H_2$ gas) and the nitrogen-containing gas (e.g., at least any one of a $N_2$ gas, a $NH_3$ gas, and a $N_2H_2$ gas) into the plasma processing space S to reduce, with plasma of the hydrogen-containing gas and the nitrogen-containing gas, the $Ni_2O_3$ deposited on the electrode plate 51 after the first process. Thus, as depicted in FIG. 5B, the $Ni_2O_3$ on the surface of the electrode plate 51 is reduced by the plasma of the hydrogen-containing gas and the nitrogen-containing gas, so that a $NH_3OH$ gas is generated and oxygen is separated from the $Ni_2O_3$ on the surface of the electrode plate 51. As a result, on the surface of the electrode plate 51, oxygen is separated from the $Ni_2O_3$ and nickel remains. For this reason, the second process may be referred to as "reduction process". The reduction process can be expressed by the following chemical reaction formula (3). Herein, a $H_2$ gas is used as an example of the hydrogen-containing gas, but at least any one of a $CH_3F$ gas, a $CH_2F_2$ gas, a $CHF_3$ gas, a $NH_3$ gas, and a $N_2H_2$ gas may be used.

$$Ni_2O_3+N_2+H_2 \rightarrow Ni+NH_3OH \tag{3}$$

Further, in FIG. 5C, a molecule model group 650 is a model of carbon. Furthermore, in FIG. 5C, a molecule model group 660 is a model of oxygen.

In the plasma process in accordance with the present example embodiment, there is performed the third process of supplying the oxygen-containing gas (e.g., a $CO_2$ gas) into the plasma processing space S and removing the nickel, which is obtained by reducing $Ni_2O_3$ in the second process, with plasma of the oxygen-containing gas. Thus, as depicted in FIG. 5C, the nickel remaining on the surface of the electrode plate 51 chemically reacts with the plasma of the oxygen-containing gas, so that a $Ni(CO)_4$ gas as a complex gas is generated and the nickel is removed from the surface of the electrode plate 51. For this reason, the third process may be referred to as "removal process". The removal process can be expressed by the following chemical reaction formula (4).

$$Ni+CO_2 \rightarrow Ni_2O_3+Ni(CO)_4 \tag{4}$$

As described above, in the plasma process and the plasma processing apparatus 1 of the present example embodiment, the fluorine-containing gas is supplied into the plasma processing space S and the wafer W is etched with the plasma of the fluorine-containing gas in the first process. Further, in the plasma process and the plasma processing apparatus 1 of the present example embodiment, the hydrogen-containing gas is supplied into the plasma processing space S and the nickel-containing material deposited on the electrode plate 51 after the first process is reduced with the plasma of the hydrogen-containing gas to remain the nickel on the surface of the electrode plate 51 in the second process. Furthermore, in the plasma process and the plasma processing apparatus 1 of the present example embodiment, the oxygen-containing gas is supplied into the plasma processing space S, and the nickel, which is obtained by reducing the nickel-containing material in the second process, is removed with the plasma of the oxygen-containing gas to generate the $Ni(CO)_4$ gas as a complex gas in the third process. For this reason, in accordance with the present example embodiment, even if the nickel-containing material generated from the wafer W during the etching process is deposited on various members facing the plasma processing space S, it is possible to remove the nickel-containing material from the members. Therefore, it is possible to suppress the variation in the plasma density within the plasma processing space. As a result, in accordance with the present example embodiment, it is possible to suppress the etching characteristics of the wafer W from being degraded (changed) with a lapse of time.

Further, in the plasma process and the plasma processing apparatus 1 of the present example embodiment, the hydrogen-containing gas and the nitrogen-containing gas may be supplied into the plasma processing space S in the second process, and the nickel-containing material deposited on the electrode plate 51 after the first process may be reduced with the plasma of the hydrogen-containing gas and the nitrogen-containing gas. For this reason, in accordance with the present example embodiment, even if the nickel-containing material deposited on various members facing the plasma processing space S contains $Ni_2O_3$, it is possible to appropriately reduce the $Ni_2O_3$ to obtain the nickel.

Figure 6:
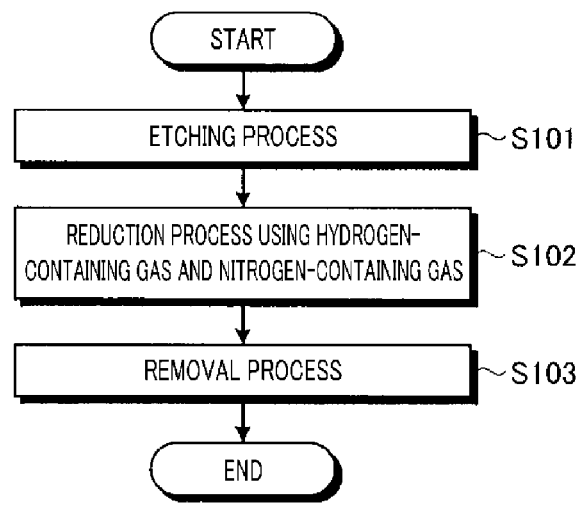
FIG. 6 is a flow chart of the plasma process in accordance with an experimental example.

Hereinafter, an experimental example of the plasma process in accordance with the present example embodiment will be explained. FIG. 6 is a flow chart of the plasma process in accordance with the experimental example.

In the plasma process in accordance with the experimental example, the etching process is performed (process S101). To be specific, the control unit 150 controls the flow rate controller 74a to supply a $C_4F_6$ gas or a $CH_2F_2$ gas and an $O_2$ gas into the plasma processing space S. Then, the control unit 150 controls the first high frequency power supply 30 and the second high frequency power supply 40 to excite the $C_4F_6$ gas or the $CH_2F_2$ gas and the $O_2$ gas into plasma to etch the wafer W with the plasma of the $C_4F_6$ gas or the $CH_2F_2$ gas and the $O_2$ gas.

Then, in the plasma process in accordance with the experimental example, the reduction process is performed using a hydrogen-containing gas and a nitrogen-containing gas (process S102). To be specific, the control unit 150 controls the flow rate controllers 74b and 74d to supply a $H_2$ gas/a $N_2$ gas into the plasma processing space S at a flow rate of 50 sccm/300 sccm, respectively. Then, the control unit 150 controls the first high frequency power supply 30 and the second high frequency power supply 40 to excite the $H_2$ gas/the $N_2$ gas into plasma to reduce $Ni_2O_3$ deposited on the electrode plate 51 facing the plasma processing space S with the plasma of the $H_2$ gas/the $N_2$ gas.

Thereafter, in the plasma process in accordance with the experimental example, the removal process is performed (process S103). To be specific, the control unit 150 controls the flow rate controller 74c to supply a $CO_2$ gas into the plasma processing space S. Then, the control unit 150 controls the first high frequency power supply 30 and the second high frequency power supply 40 to excite the $CO_2$ gas into plasma to remove the nickel, which is obtained by reducing the $Ni_2O_3$, with the plasma of the $CO_2$ gas.

In the plasma process in accordance with the experimental example, the wafer W is etched through the etching process, and the $Ni_2O_3$ deposited on the electrode plate 51 is reduced through the reduction process, so that the nickel remains on the surface of the electrode plate 51. Then, the nickel as a complex gas $Ni(CO)_4$ can be removed through the removal process. For this reason, in the plasma process in accordance with the experimental example, even if the nickel-containing material generated from the wafer W during the etching process is deposited on the electrode plate 51, it is possible to remove $Ni_2O_3$ contained in the nickel-containing material with high efficiency. Therefore, it is possible to suppress the variation in the plasma density within the plasma processing space S. As a result, it is possible to suppress the etching characteristics of the wafer W from being degraded with a lapse of time. Although the experimental example illustrates an example where a set of the reduction process using the hydrogen-containing gas and the nitrogen-containing gas and the removal process is performed one time after the etching process, the set of the reduction process using the hydrogen-containing gas and the nitrogen-containing gas and the removal process may be repeatedly performed two or more times after the etching process.

Figure 7:
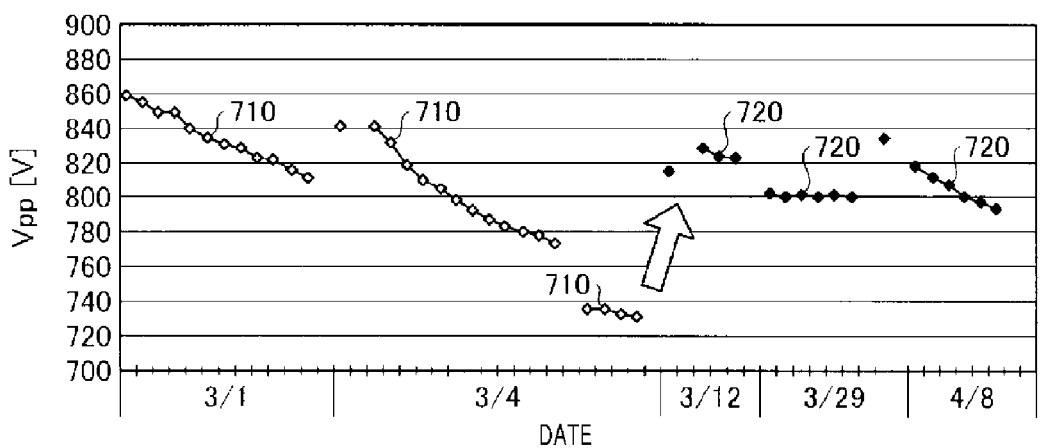
FIG. 7 is a diagram (first diagram) for explaining an effect of a plasma processing method in accordance with the present example embodiment.

Then, an effect of the plasma processing method in accordance with the present example embodiment will be explained. FIG. 7 is a diagram (first diagram) for explaining an effect of the plasma processing method in accordance with the present example embodiment. FIG. 7 illustrates the variation in Vpp on the wafer W in the case of performing the plasma process in accordance with the present example embodiment. Herein, the Vpp denotes a difference between the maximum value and the minimum value of a voltage in the high frequency power on the surface of the wafer W. In FIG. 7, a vertical axis represents the Vpp (V) of the wafer W, and a horizontal axis represents a date on which the Vpp on the wafer W is measured. It can be found out that the Vpp (V) correlates with the plasma density caused by the high frequency power, and it can be found out that the variation in the Vpp (V) corresponds to the variation in the plasma density.

A graph group 710 of FIG. 7 shows a relationship between the Vpp on the wafer W and a date when a dry cleaning (DC) process is performed to the wafer W by an $O_2$ gas without performing the plasma process in accordance with the present example embodiment. A graph group 720 shows a relationship between the Vpp on the wafer W and a date when the plasma process of the present example embodiment is performed after the DC process is performed.

As shown in the graph group 710, when the DC process is performed without performing the plasma process in accordance with the present example embodiment, the Vpp on the wafer W is decreased with a lapse of the measuring date. It is assumed that this is because the nickel-containing material generated from the nickel silicide film D1 of the wafer W during the etching process is accumulatively deposited on the various members facing the plasma processing space S, so that the plasma density within the plasma processing space S is varied.

Meanwhile, in the case of performing the plasma process in accordance with the present example embodiment, the nickel-containing material deposited on the electrode plate 51 is removed through the reduction process and the removal process. As a result, as shown in the graph group 720, the Vpp on the wafer W has the substantially same as the Vpp corresponding to the date "3/1" on which the Vpp on the wafer W is measured. It is assumed that this is because even if the nickel-containing material generated from the nickel silicide film D1 on the wafer W during the etching process is deposited on the various members facing the plasma processing space S, the nickel-containing material is appropriately removed from those members.

Figure 8:
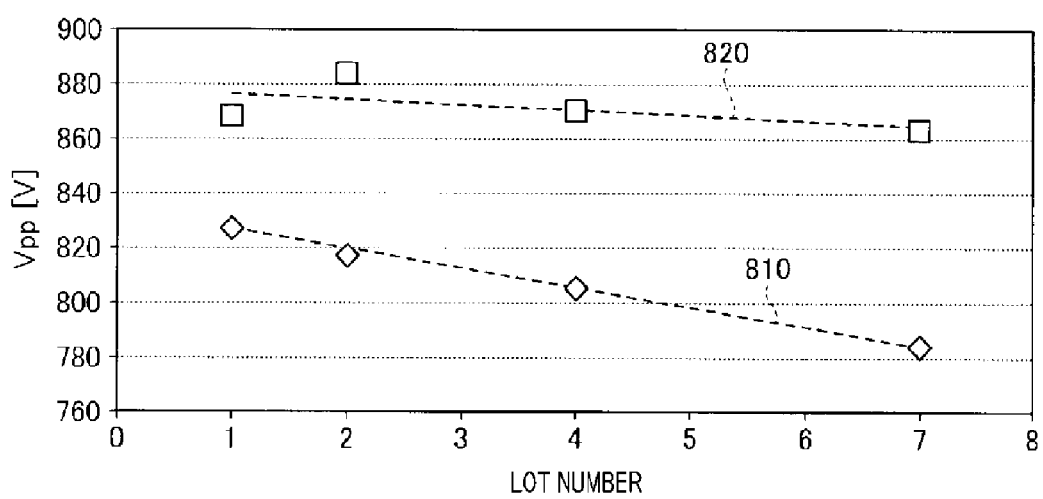
FIG. 8 is a diagram (second diagram) for explaining an effect of the plasma processing method in accordance with the present example embodiment.

FIG. 8 is a diagram (second diagram) for explaining an effect of the plasma processing method in accordance with the present example embodiment. A horizontal axis in FIG. 8 represents a lot number of the wafer W loaded into the plasma processing apparatus 1, and a vertical axis represents the Vpp (V) on the wafer W.

In FIG. 8, a graph 810 shows a relationship between the Vpp on the wafer W and the lot number of the wafer W in the case of performing a DC process without performing the plasma process in accordance with the present example embodiment. A graph 820 shows a relationship between the Vpp on the wafer W and the lot number of the wafer W in the case of performing the plasma process in accordance with the present example embodiment.

Through the comparison between the graph 810 and the graph 820, the decrement in the Vpp on the wafer W in the case of performing the plasma processing method in accordance with the present example embodiment is smaller than the decrement in the Vpp on the wafer W in the case of performing only the DC process. In this example embodiment, the decrement in the Vpp on the wafer W in the case of performing the plasma processing method in accordance with the present example embodiment is decreased by 72% as compared with the decrement in the Vpp on the wafer W in the case of performing only the DC process. It is assumed that this is because in the case of performing the plasma process in accordance with the present example embodiment, even if the nickel-containing material generated from the nickel silicide film D1 on the wafer W during the etching process is deposited on the various members facing the plasma processing space S, the nickel-containing material is appropriately removed from those members.

EXPLANATION OF REFERENCE NUMERALS

1: Plasma processing apparatus
11: Processing vessel
20: Focus ring
30: First high frequency power supply
40: Second high frequency power supply
42: Upper electrode
51: Electrode plate
52: Electrode supporting body
72: Processing gas supply source
72a, 72b, 72c, 72d: Gas supply units
74a, 74b, 74c, 74d: Flow rate controllers
150: Control unit
D1: Nickel silicide film
D2, D4: Silicon nitride film
D3, D5: Silicon oxide film
W: Wafer

We claim:

1. A plasma processing method performed in a plasma processing apparatus, the plasma processing method comprising:
a first process of supplying a fluorine-containing gas into a plasma processing space to generate plasma of the fluorine-containing gas and etching a target substrate, in which at least one of a silicon oxide film and a silicon nitride film is formed on a surface of a nickel silicide film, with the plasma of the fluorine-containing gas;
a second process of supplying a hydrogen-containing gas into the plasma processing space to generate plasma of the hydrogen-containing gas and reducing, with the plasma of the hydrogen-containing gas, a nickel-containing material deposited on a member, of which a surface is arranged to face the plasma processing space, after the first process; and
a third process of supplying an oxygen-containing gas into the plasma processing space to generate plasma of the oxygen-containing gas and removing nickel, which is obtained by reducing the nickel-containing material in the second process, with the plasma of the oxygen-containing gas,
wherein variation in Vpp on the target substrate is suppressed by removing the nickel-containing material deposited on the member, of which the surface is arranged to face the plasma processing space, through the second process and the third process.

2. The plasma processing method of claim 1, wherein the second process and the third process are repeatedly performed at least twice.

3. The plasma processing method of claim 1, wherein the second process is performed by supplying the hydrogen-containing gas and a nitrogen-containing gas.

4. The plasma processing method of claim 3,
wherein the nitrogen-containing gas is at least one of a $N_2$ gas, a $NH_3$ gas, and a $N_2H_2$ gas.

5. The plasma processing method of claim 1,
wherein the hydrogen-containing gas is at least one of a $H_2$ gas, a $CH_3F$ gas, a $CH_2F_2$ gas, a $CHF_3$, a $NH_3$ gas, a $N_2H_2$ gas.

6. The plasma processing method of claim 1,
wherein the oxygen-containing gas is at least one of an $O_2$ gas, a $CO_2$ gas, and a CO gas.

7. A plasma processing apparatus comprising:
a processing vessel configured to partition a plasma processing space accommodating therein a target substrate, in which at least one of a silicon oxide film and a silicon nitride film is formed on a surface of a nickel silicide film;
a first gas supply unit configured to supply a fluorine-containing gas into the plasma processing space;
a second gas supply unit configured to supply a hydrogen-containing gas into the plasma processing space;
a third gas supply unit configured to supply an oxygen-containing gas into the plasma processing space; and
a control unit configured to perform a first process of supplying the fluorine-containing gas into the plasma processing space from the first gas supply unit to generate plasma of the fluorine-containing gas and etching the target substrate with the plasma of the fluorine-containing gas; a second process of supplying the hydrogen-containing gas into the plasma processing space from the second gas supply unit to generate plasma of the hydrogen-containing gas and reducing, with the plasma of the hydrogen-containing gas, a nickel-containing material deposited on a member, of which a surface is arranged to face the plasma processing space, after the first process; and a third process of supplying the oxygen-containing gas into the plasma processing space from the third gas supply unit to generate plasma of the oxygen-containing gas and removing nickel, which is obtained by reducing the nickel-containing material in the second process, with the plasma of the oxygen-containing gas, and configured to suppress variation in Vpp on the target substrate by removing the nickel-containing material deposited on the member, of which the surface is arranged to face the plasma processing space, through the second process and the third process,
wherein the variation in the Vpp on the target substrate is suppressed by removing the nickel-containing material deposited on the member, of which the surface is arranged to face the plasma processing space, through the second process and the third process.

8. The plasma processing apparatus of claim 7,
wherein the hydrogen-containing gas is at least one of a $H_2$ gas, a $CH_3F$ gas, a $CH_2F_2$ gas, a $CHF_3$, a $NH_3$ gas, and a $N_2H_2$ gas.

* * * * *

UNITED STATES PATENT AND TRADEMARK OFFICE
CERTIFICATE OF CORRECTION

PATENT NO. : 9,209,041 B2  
APPLICATION NO. : 14/424497  
DATED : December 8, 2015  
INVENTOR(S) : Akitoshi Harada Page 1 of 1

It is certified that error appears in the above-identified patent and that said Letters Patent is hereby corrected as shown below:

In the specification,

Column 3, line 42, please replace "$NH_3$ qas" with -- $NH_3$ gas --

Signed and Sealed this  
Fifteenth Day of March, 2016

Michelle K. Lee  
*Director of the United States Patent and Trademark Office*